United States Patent [19]
Albon et al.

[11] Patent Number: 5,467,312
[45] Date of Patent: Nov. 14, 1995

[54] RANDOM ACCESS MEMORY

[75] Inventors: Richard Albon, Tavistock; David Williams, Plymouth, both of United Kingdom

[73] Assignee: Plessey Semiconductors Limited, United Kingdom

[21] Appl. No.: 221,073

[22] Filed: Mar. 31, 1994

[30] Foreign Application Priority Data

Apr. 21, 1993 [GB] United Kingdom .................. 9308208

[51] Int. Cl.⁶ .................................................. G11C 7/00
[52] U.S. Cl. .............................. 365/189.01; 365/184.08; 365/196; 365/202; 365/203; 365/227
[58] Field of Search ......................... 365/189.01, 189.08, 365/190, 196, 202, 203, 207, 208, 227

[56] References Cited

U.S. PATENT DOCUMENTS

| | | | |
|---|---|---|---|
| 4,739,499 | 4/1988 | Simpson | 365/203 |
| 4,815,040 | 3/1989 | Matsui et al. | 365/203 |
| 4,939,691 | 7/1940 | Mizukami et al. | 365/203 |
| 4,969,125 | 11/1990 | Ciraula et al. | 365/203 |
| 5,083,295 | 1/1992 | Lammerts et al. | 365/207 |
| 5,091,879 | 2/1992 | Tran | 365/207 |
| 5,272,670 | 12/1993 | Hashimoto | 365/208 |
| 5,272,674 | 12/1993 | Pathak et al. | 365/208 |

FOREIGN PATENT DOCUMENTS

| | | |
|---|---|---|
| 0155787A2 | 2/1985 | European Pat. Off. . |
| 0228958A2 | 7/1987 | European Pat. Off. . |
| 57-130285 | 8/1982 | Japan ............ 365/203 |
| 2187351 | 9/1987 | United Kingdom . |

Primary Examiner—David C. Nelms
Assistant Examiner—Tan Nguyen
Attorney, Agent, or Firm—Kirschstein, et al.

[57] ABSTRACT

A current sensing read arrangement for a static random access memory in which critical nodes in the sensing arrangement are equalised before read-out commences, and in which differential outputs are applied to a gating arrangement which terminates the read-out as soon as a recognisable output signal is obtained, so as to minimise power consumption.

4 Claims, 1 Drawing Sheet

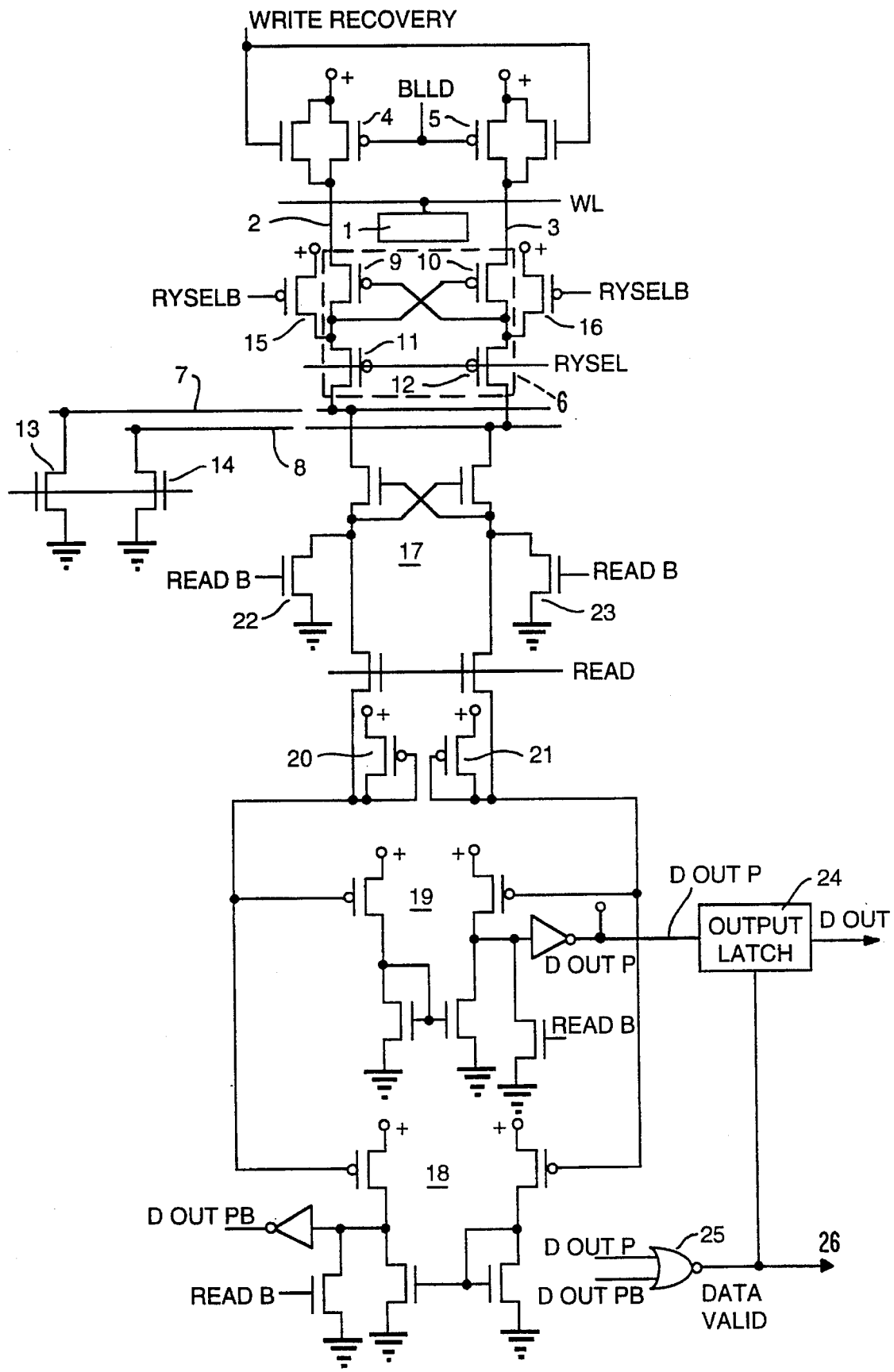

RANDOM ACCESS MEMORY

BACKGROUND OF THE INVENTION

1. Field of the Invention

The present invention relates to random access memories, and in particular to read sensing arrangements for random access memories.

2. Description of the Related Art

Static random access memories may comprise arrays of memory cells that are each made up of a pair of cross-coupled inverters with a pair of input/output access paths that are connected by way of respective access transistors to a pair of bit lines. The memory cells are arranged in rows and columns, with the memory cells of each column sharing access to a respective pair of bit lines. Except during read or write operations these bit lines are held at a common fixed potential by precharge circuits.

During a read operation, the access paths of any one memory cell of a column are enabled by raising the potential of a respective word line connected to the gate electrodes of the access transistors, whereupon the current/voltage conditions on the respective bit lines start to diverge in a sense dependent upon the data value held in the memory cell, the speed at which they diverge being determined by factors such as the drive from the memory cell and the capacitance of the bit lines. Since typical memory devices incorporate many of these pairs of bit lines the effect on the power consumption can be quite marked.

Known memory designs using voltage sensing techniques take a small bit line differential voltage signal and amplify it over several stages to obtain the necessary data signal levels with a high speed of response, but such techniques have a number of disadvantages, such as the power consumption and the delay involved in effecting the required voltage changes.

There are designs which use current sensing techniques, such as those discussed by Seevink et al. in IEEE Journal of Solid State Circuits, Vol. 26, No. 4, April 1991, pp 525–535, which have the advantage of offering lower power consumption since high capacitance modes such as bit lines and data bus lines do not have to change in voltage. However, these known current sensing arrangements do not provide for effective equalisation of critical nodes to allow a fast response when the current sensing amplifiers are turned on, so that a period of time is generally needed to allow for settling before correct sensing can take place.

SUMMARY OF THE INVENTION

According to one aspect of the present invention in a semiconductor integrated circuit static random access memory comprising a plurality of memory cells arranged in rows and columns, the memory cells each having differential access paths which in respect of the memory cells of any column of the array are connected to respective ones of a pair of bit lines associated with that column, a current sensing read arrangement comprises a current conveyor and column select means interposed between the bit lines associated with a column and a pair of data bus lines associated with a plurality of columns, and means selectively to apply substantially equal potentials to intermediate nodes of said current conveyor and column select means whereby the potentials at said intermediate nodes may be equalised immediately prior to a read operation.

Preferably said current conveyor and column select means comprises respective first and second transistors in cascade between each bit line and the respective data bus line, the gate and drain electrodes of the respective first transistors being cross-coupled. The four transistors are arranged to operate in saturation during a read operation.

According to another aspect of the present invention in a semiconductor integrated circuit static random access memory comprising a plurality of memory cells arranged in rows and columns, the memory cells having differential access paths which are arranged selectively to be connected to read sensing means providing data signals to differential data output paths during a read operation, there are provided gating means to which said differential output paths are connected and means responsive to a data-valid output from said gating means effectively to terminate said read operation.

Preferably there are provided latch means arranged to register the data value on said output paths in response to said data-valid output from said gating means. The gating means may comprise an exclusive-OR gate.

BRIEF DESCRIPTION OF THE DRAWING

A read sensing arrangement for a static random access memory in accordance with the present invention will now be described by way of example with reference to the accompanying drawing, which shows part of the arrangement diagrammatically.

DETAILED DESCRIPTION OF THE PREFERRED EMBODIMENT

Referring to the drawing, the memory cells 1 of a column, of which only one is shown, are accessed in common by way of differential bit lines 2 and 3, these bit lines being connected at one end by way of p-channel load transistors 4 and 5 to a positive supply and at the other end by way of a current sensing amplifier 6 to respective data bus lines 7 and 8. The sensing amplifier 6 combines the functions of current conveyor circuit and column selection, the four p-channel transistors 9 to 12 operating in saturation during a read operation, and with the transistors 9 and 10 having their gates and drains cross-coupled the voltages on the bit lines 2 and 3 are held substantially equal whatever the current distribution on these bit lines. The data bus lines 7 and 8 are connected to earth potential by way of respective n-channel load transistors 13 and 14.

Between read operations the load transistors 4 and 5, 13 and 14 are switched off, as are the column select transistors 11 and 12, and the potentials at the nodes between transistors 9 and 11 and 10 and 12 are equalised by connecting them to the positive supply potential by way of transistors 15 and 16, which are controlled by the inverse of the column select signal, ryselb, and which are switched off during read operations.

During a read operation when a memory cell 1 is accessed the differential current from the cell flows into the bit lines 2 and 3 which themselves are drawing a small quiescent current through the respective load transistors 4 and 13, 5 and 14. Due to the action of the sensing amplifier 6, however, the voltages on the bit lines will change very little, but the differential current from the cell 1 will be passed to the data bus lines 7 and 8.

A further current sensing amplifier 17 comprising four n-channel transistors is connected between the data bus lines 7 and 8 and a pair of differential current mirror circuits 18 and 19, the sensing amplifier 17 serving to maintain the data bus lines at equal potentials and effectively to pass any differential current to p-channel load transistors 20 and 21, which convert the differential current to a differential voltage. Again the intermediate nodes of the sensing amplifier 17 are arranged to be equalised between read sensing operations, by means of n-channel transistors 22 and 23.

An output signal doutp from the current mirror circuit 19 is applied to an output latch 24, and output signals doutp and doutpb from the current mirror circuits 19 and 18 respectively are applied to a gating arrangement 25, shown as a NOR gate, although it effectively has an exclusive-OR function. In response to a suitable level of divergence between these output signals doutp and doutpb the gating arrangement 25 provides a data-valid signal to latch the data value dout, represented by the output signals doutp and doutpb, into the latch 24 and to provide a signal on the path 26 to terminate the read operation. This alleviates the need for memory configuration-dependent self timed circuits, and provides a degree of self-regulation on power consumption. Thus, if the ambient temperature falls so that drive currents to the transistors increase, which normally results in an increase in power consumption, the accompanying increase in speed of operation results in an earlier response from the gating arrangement 25, counteracting the power increase by earlier termination of the read operation.

We claim:

1. A semiconductor integrated circuit static random access memory comprising a plurality of memory cells arranged in rows and columns, the memory cells each having differential access paths which in respect of the memory cells of any column of the array are connected to respective ones of a pair of bit lines associated with that column, wherein a current sensing read arrangement comprises a current conveyor and column select means interposed between the bit lines associated with a column and a pair of data bus lines associated with a plurality of columns, said current conveyor and column select means including respective first and second transistors in cascade between each bit line and the respective data bus line, the gate and drain electrodes of the respective first transistors being cross-coupled, and means for selectively applying substantially equal potentials to nodes intermediate respective first and second transistors of said current conveyor and column select means whereby the potentials at said intermediate nodes are equalized immediately prior to a read operation.

2. A random access memory in accordance with claim 1 wherein the four transistors are arranged to operate in saturation during a read operation.

3. A semiconductor integrated circuit static random access memory comprising a plurality of memory cells arranged in rows and columns, the memory cells having differential access paths which are arranged selectively to be connected to read sensing means providing data signals to differential data output paths during a read operation, and gating means to which said differential output paths are connected, said gating means being responsive to data signals on said output paths to provide a data-valid output signal for effectively terminating said read operation.

4. A random access memory in accordance with claim 3 and latch means arranged for registering a data value on said output paths in response to said data-valid output signal from said gating means.

* * * * *